(12) United States Patent
Chen et al.

(10) Patent No.: US 6,177,359 B1
(45) Date of Patent: Jan. 23, 2001

(54) METHOD FOR DETACHING AN EPITAXIAL LAYER FROM ONE SUBSTRATE AND TRANSFERRING IT TO ANOTHER SUBSTRATE

(75) Inventors: Yong Chen; Shih-Yuan Wang, both of Palo Alto, CA (US)

(73) Assignee: Agilent Technologies, Inc., Palo Alto, CA (US)

( * ) Notice: Under 35 U.S.C. 154(b), the term of this patent shall be extended for 0 days.

(21) Appl. No.: 09/326,337

(22) Filed: Jun. 7, 1999

(51) Int. Cl.$^7$ .................................................. H01L 21/00
(52) U.S. Cl. ......................... 438/751; 438/458; 438/460
(58) Field of Search .................................... 438/455, 456, 438/458, 460, 464, 718, 745, 751; 117/2

(56) References Cited

U.S. PATENT DOCUMENTS

| | | | |
|---|---|---|---|
| 5,073,230 | 12/1991 | Maracas et al. | 156/631 |
| 5,328,549 | 7/1994 | Bozler et al. | 437/226 |
| 5,376,229 | * 12/1994 | Miller et al. | 438/745 X |
| 5,683,596 | * 11/1997 | Kaneko | 438/745 |
| 5,710,057 | 1/1998 | Kenney | 437/62 |

OTHER PUBLICATIONS

Beaumont, et al., "Lateral Overgrowth of GaN on Patterned GaN/Sapphire Substrate via Selective Metal Organic Vapour Phase Epitaxy: A Route to Produce Self Supported GaN Substrates", Journal of Crystal Growth, 189/190, 1998, pp. 97–102.

Shuj Makamura, "InGaN/GaN/AlGaN–based Laser Diodes Grown on Free–Standing GaN Substrates", Material Science and Engineering, B59, 1999, pp. 370–375.

* cited by examiner

*Primary Examiner*—William Powell

(57) ABSTRACT

A method for detaching an epitaxial layer from one substrate and transferring it to another substrate allows an epitaxially grown material layer to be easily detached from a first substrate that has good epitaxial growth properties and transferred to another substrate having better cleaving, electrical or other properties than the first substrate. A mask is applied to a portion of a surface of the first epitaxial layer and a second epitaxial layer is grown over the first epitaxial layer and the mask. A trench is formed in the second epitaxial layer to expose the mask and a second substrate is bonded to the second epitaxial layer. An etchant is introduced through the trench and etches away the mask, thus releasing the second epitaxial layer from the first substrate and the first epitaxial layer. Thus, the second epitaxial layer has been released from the first substrate and transferred to the second substrate without performing operations that would impair the optical properties of the epitaxial material.

12 Claims, 9 Drawing Sheets

METHOD FOR DETACHING AN EPITAXIAL LAYER FROM ONE SUBSTRATE AND TRANSFERRING IT TO ANOTHER SUBSTRATE

FIELD OF THE INVENTION

The invention relates generally to the fabrication of semiconductor materials, and, more particularly, to a method for detaching and transferring an epitaxially grown layer from one substrate to another substrate.

BACKGROUND OF THE INVENTION

A building block of many electronic devices such as diodes, transistors, and lasers is semiconductor material that can be grown over a substrate. The semiconductor material is fabricated by growing an epitaxial layer of the semiconductor material upon a substrate. The substrate material may be, and frequently is, of a different composition and lattice parameter than the material used to grow the epitaxial layer. For example, an epitaxial layer of gallium nitride (GaN) may be grown upon a sapphire substrate.

Various light emitting structures may be fabricated from the semiconductor material. To complete these structures, it is often desirable to detach and transfer the epitaxial layer from the original substrate to another substrate. For example, when fabricating an edge-emitting laser, it is necessary to cleave the epitaxial layer to obtain a reflecting surface. Cleaving is a process by which an edge of a wafer, including a substrate and an epitaxial layer, is nicked, or scored, and the wafer snapped to expose a clean, smooth cross-section of the epitaxial material along the lattice facet. A parallel pair of facets are used as reflective mirrors in an edge-emitting semiconductor laser.

Cleaving, however, is difficult to perform while the GaN epitaxial layer is attached to a sapphire ($Al_2O_3$) substrate. Therefore, when a GaN epitaxial layer is grown upon sapphire, it is desirable to separate the GaN from the sapphire substrate. This is so because the sapphire substrate does not cleave easily, and also because the sapphire and the GaN epitaxial material have different lattice constants, resulting in lattice planes that do not accurately align. This prevents obtaining a clean, parallel facet of the epitaxial layer by cleaving if the epitaxial layer and the sapphire substrate are attached to each other. Therefore, for edge-emitting lasers it is desirable to detach and transfer the epitaxial layer from the sapphire substrate to a different substrate, such as silicon (Si), that is more easily cleaved.

A vertical cavity surface emitting laser (VCSEL) generally includes a region of multiple quantum well layers composed of very thin alternating layers of GaN and AlGaN around which are formed distributed Bragg reflectors.

In conventional VCSELs, at least the DBR between the substrate and the quantum-well layers is formed from alternating GaN and AlGaN layers so that the quantum well layers can be grown on crystalline material with about the correct lattice parameters. However, crystalline GaN/AlGaN DBRs are difficult to make with sufficient reflectivity. Dielectric DBRs composed of alternating layers of two dielectric materials such as silicon dioxide (SiO2) and hafnium oxide (HfOx) are easier to make with the required reflectivity, but quantum well layers cannot be grown on top of these dielectric layers.

It would be desirable to be able to grow a partial VCSEL structure, including a first cladding layer, a set of quantum well layers, a second cladding layer and a first dielectric DBR, on one substrate and transfer it to another substrate. This places the second cladding layer and the first DBR in contact with the new substrate and exposes the first cladding layer, over which could then be grown a second dielectric DBR.

In the past, epitaxial layers have been separated from sapphire substrates by using a laser to melt the epitaxial layer at its interface with the substrate on which it is grown. In the case of a GaN epitaxial layer grown over a sapphire substrate, the output of an ultra-violet laser is directed through the sapphire substrate and melts a thin layer of the GaN near the GaN/sapphire interface, thus enabling the GaN epitaxial layer to be separated from the sapphire substrate.

A drawback with using a laser to separate an epitaxial layer from the substrate is that due to the limitation of the laser spot size, only a small portion of the epitaxial layer may be separated at a time.

Another drawback with using a laser to separate the epitaxial layer from the substrate is that it is difficult to control the penetration depth of the laser light. This may result in a portion of the GaN epitaxial layer being rendered potentially unusable due to surface roughening and thermal shock within the material. The penetration depth is difficult to control because the heat dissipated at the GaN/sapphire interface cannot be precisely controlled.

Thus, an unaddressed need exists in the industry for a more controllable, practical method for detaching an epitaxial layer from a substrate and transferring the epitaxial layer to another substrate.

SUMMARY OF THE INVENTION

The invention provides a method for detaching an epitaxial layer from one substrate and transferring it to another substrate. Although not limited to these particular applications, the method for detaching an epitaxial layer from one substrate and transferring it to another is particularly suited for detaching an epitaxial layer of a GaN material from a sapphire substrate and transferring it to a substrate of another material such as silicon (Si). The GaN material can include members of the Group III-V family including, but not limited to, gallium nitride (GaN), indium gallium nitride (InGaN), indium nitride (InN), aluminum gallium nitride (AlGaN), aluminum nitride (AlN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), aluminum gallium phosphide nitride (AlGaPN), etc.

The invention can be conceptualized as a method for detaching an epitaxial layer from one substrate and transferring the epitaxial layer to another substrate, the method comprising the steps of: growing a first epitaxial layer over a first substrate; depositing a mask over a portion of a surface of the first epitaxial layer; growing a second epitaxial layer over the first epitaxial layer; forming a trench in the second epitaxial layer to expose the mask; bonding a second substrate to the second epitaxial layer; and introducing an etchant through the trench to etch the mask to detach the second epitaxial layer from the first epitaxial layer.

When employed in connection with the fabrication of an epitaxial layer over a sapphire substrate, the above-mentioned method for detaching an epitaxial layer from a substrate and transferring it to another substrate results in a stable, uniform epitaxial layer, suitable for fabricating high quality optical devices.

The invention has numerous advantages, a few which are delineated below merely as examples.

An advantage of the invention is that it allows the formation of high quality facets, suitable for the production of high quality optical devices.

Another advantage of the invention is that it allows VCSELs to be fabricated that incorporate high-reflectivity dielectric DBRs grown on a detached, exposed surface of an epitaxial layer.

Another advantage of the invention is that it improves the current distribution within an optical device.

Another advantage of the invention is that it is simple and easily implemented on a mass scale for commercial production.

Other features and advantages of the invention will become apparent to one with skill in the art upon examination of the following drawings and detailed description. These additional features and advantages are intended to be included herein within the scope of the invention.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the invention.

DETAILED DESCRIPTION OF THE PREFERRED EMBODIMENT

The invention can be implemented using a variety of substrate and epitaxial growth materials. While applicable to a variety of materials, the preferred embodiment of the method for detaching an epitaxial layer from one substrate and transferring it to another is particularly useful for efficiently detaching an epitaxially grown layer of a gallium nitride material from a sapphire substrate and transferring it to a substrate of another material such as silicon (Si). The GaN material can include members of the Group III-V family including, but not limited to, gallium nitride (GaN), indium gallium nitride (InGaN), indium nitride (InN), aluminum gallium nitride (AlGaN), aluminum nitride (AlN), aluminum gallium nitride (AlGaN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), aluminum gallium phosphide nitride (AlGaPN), etc. The concepts and features of the invention are applicable to epitaxial layers of other materials and to other substrate materials. Furthermore, the growth of an epitaxial layer over an epitaxial layer of the same material, as well as the growth of an epitaxial layer over an epitaxial layer of a different material are included within the invention.

Figure 1A:
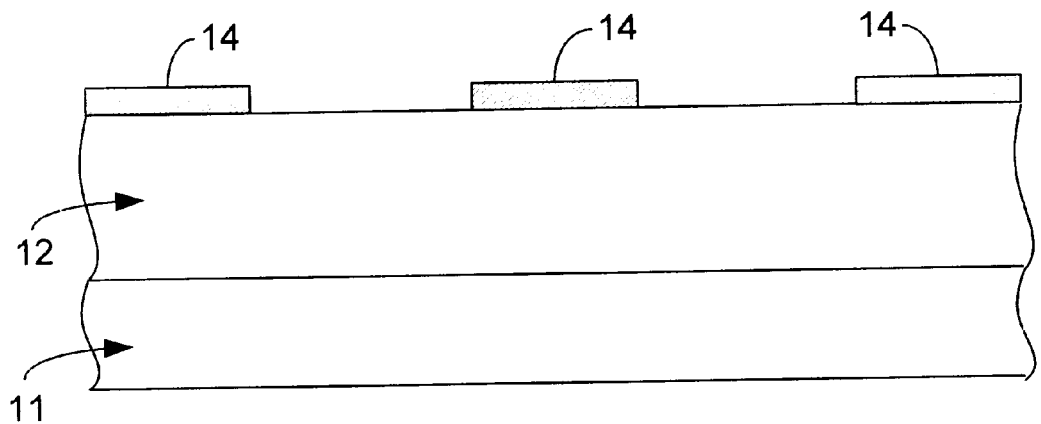
FIGS. 1A–1E are cross-sectional schematic views illustrating the method for detaching an epitaxial layer from one substrate and transferring it to another in accordance with the invention.

Turning now to the drawings, FIGS. 1A–1E illustrate a first embodiment of the method according to the invention for detaching an epitaxial layer from one substrate and transferring it to another. FIG. 1A shows epitaxial assembly 10. Epitaxial assembly 10 includes sapphire substrate 11 over which is grown a first epitaxial layer of GaN 12. Sapphire is a form of $Al_2O_3$, which is a nearly ideal insulating material, that has lattice parameters that allow high-quality layers of GaN to be grown. Over the top surface of first epitaxial GaN layer 12 is deposited mask 14. Mask 14 should be of a material capable of preventing epitaxial growth and that etches preferentially relative to any of the materials used in the first epitaxial GaN layer 12, a second epitaxial layer that will be grown over first epitaxial GaN layer 12, and a second substrate that will be attached to the second epitaxial layer. The second substrate and the second layer will be discussed below. The material of mask 14 may be dielectric material such as silicon dioxide ($SiO_2$), or may be a conducting material such as tungsten. Mask 14 covers a portion of the surface of first epitaxial GaN layer 12.

The portions of the surface of first epitaxial GaN layer 12 covered by mask 14 define the locations where the second epitaxial GaN layer 17 grown on first epitaxial GaN layer 12 will be separated from first epitaxial GaN layer 12. Ideally, from the viewpoint of wasting as little of the material of second epitaxial GaN layer 17 as possible, it is desirable to make the windows in mask 14 as narrow as possible. In practice, however, the minimum width of the windows is limited by two factors. First, the surface of first epitaxial GaN layer 12 should be exposed in places so that it can act as a seed layer for second epitaxial GaN layer 17. Second, access should be provided for the etchant to remove the mask. The elongate windows in the mask 14 represent the current preferred embodiment. Circular or polygonal windows could alternatively be used.

Figure 1B:
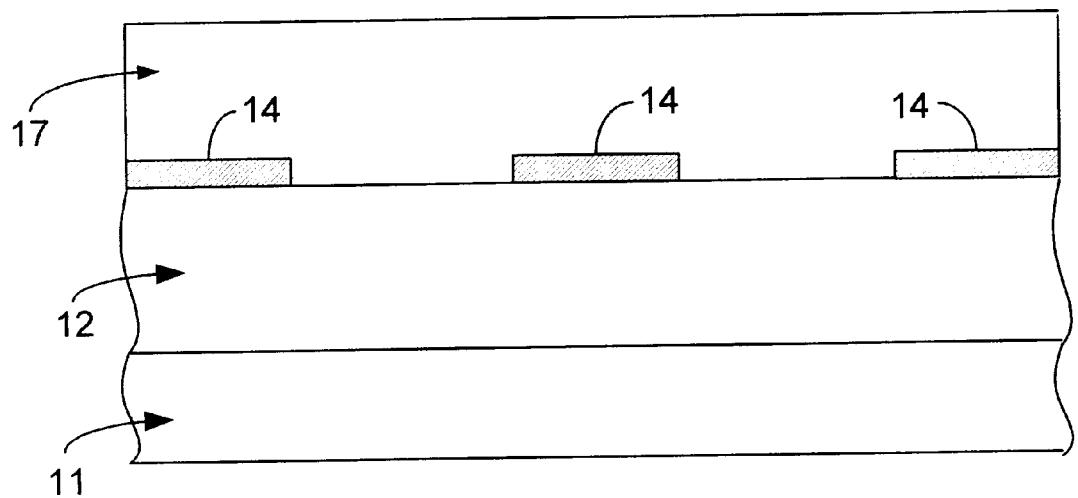

A second epitaxial layer of GaN is then grown upon first epitaxial GaN layer 12 as shown in FIG. 1B. When second epitaxial GaN layer 17 is grown, it initially grows on the exposed surface of first epitaxial GaN layer 12. After it has filled the windows in the mask 14 it forms a continuous epitaxial layer over first epitaxial GaN layer 12 and mask 14.

Although shown herein as a single layer of GaN material, second epitaxial GaN layer 17 may indeed include additional epitaxial layers such as doped semiconductor layers, cladding layers and an active layer. These additional layers are normally formed when making a semiconductor light emitting device, such as a semiconductor laser. It should be understood that second epitaxial GaN layer 17 may include many such additional layers as required for the device being fabricated. However, the concepts of the invention are applicable irrespective of the composition of second epitaxial GaN layer 17.

Figure 1C:
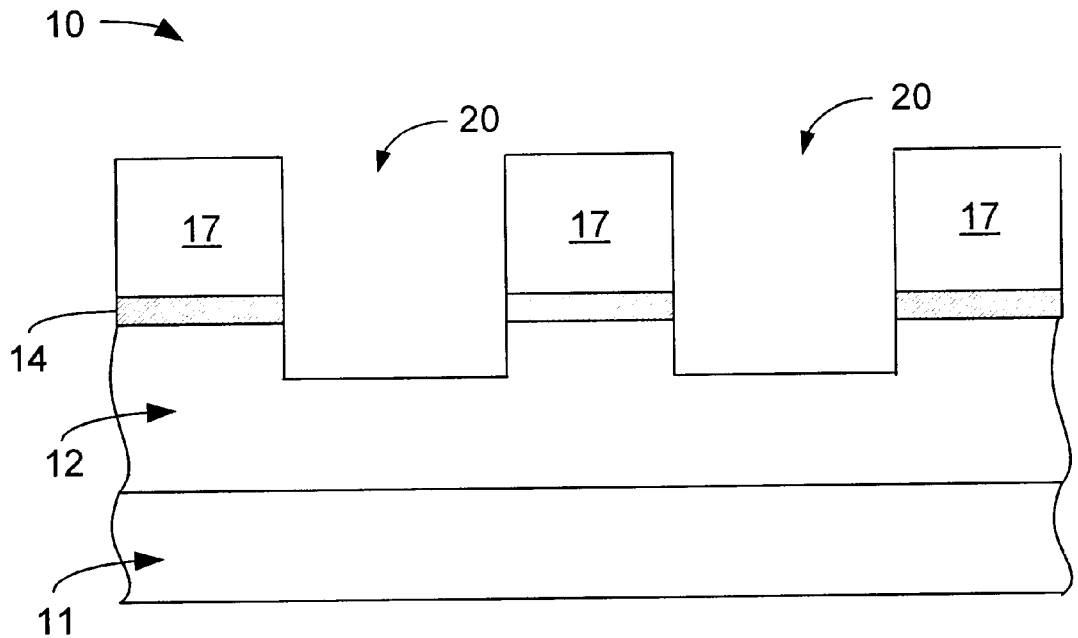

A trench 20 is then formed that extends through the second epitaxial GaN layer 17 to expose the mask 14, as shown in FIG. 1C. The trench 20 may extend into a portion of the first epitaxial GaN layer 12. Trench 20 forms a channel through which an etchant, which will be described in detail below, will later flow to remove mask 14. The trench-forming operation needs to remove the entire portions of the second epitaxial GaN layer 17 that are in direct contact with the surface of first epitaxial GaN layer 12 so that only the portions of second epitaxial GaN layer 17 that are joined to first epitaxial GaN layer 12 by the mask 14 remain.

Trench 20 is, for example but not limited to, etched through second epitaxial GaN layer 17 to expose mask 14 as shown in FIG. 1C. It should be mentioned that trench 20 may also extend completely through the first epitaxial GaN layer 12 to sapphire substrate 11 to enhance etchant flow.

Figure 1D:
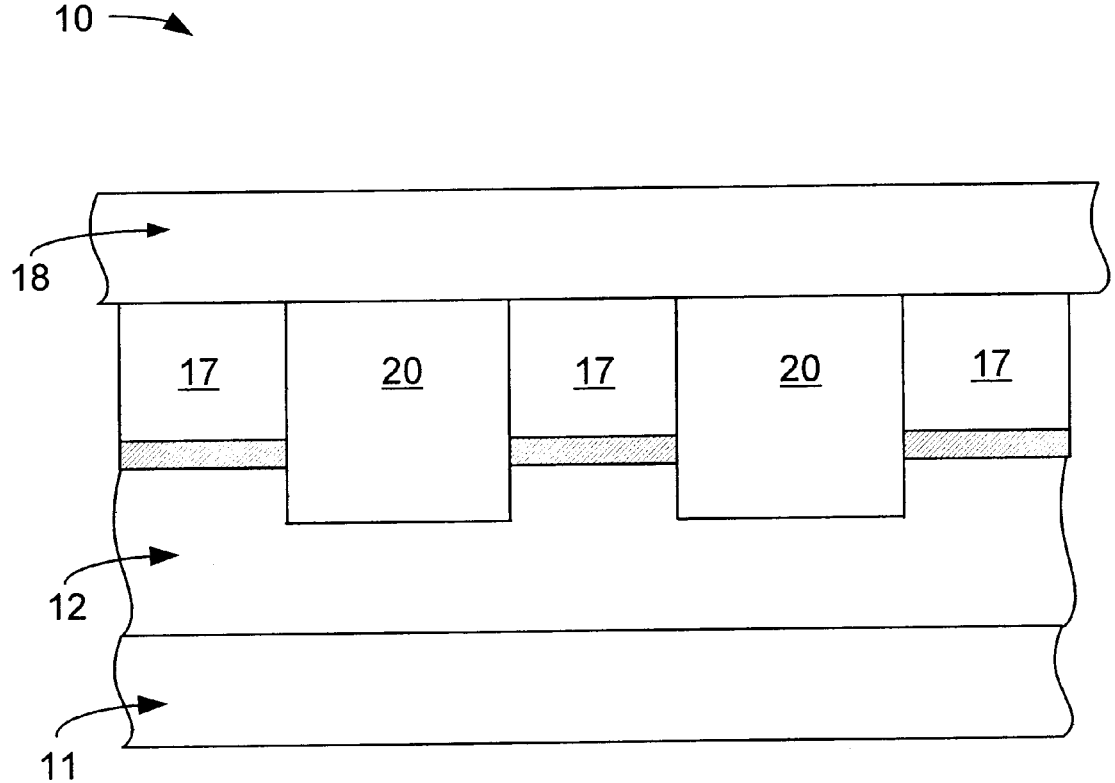

A second substrate 18 is applied over the exposed surface of second epitaxial GaN material 17 as illustrated in FIG. 1D. In this preferred embodiment, a second substrate 18 is bonded to the exposed surfaces of second epitaxial GaN layer 17 by wafer bonding, as known to those skilled in the art. In this embodiment, the second substrate 18 is a conductive substrate of silicon (Si) and is selected for its good cleaving properties. The second substrate has two functions. First and foremost, the second substrate provides mechanical support to the epitaxial layers that will be detached from the first substrate; and the second substrate preferably also has electrical properties that enable it to form a good electrical contact with the top surface of second epitaxial GaN material 17.

In accordance with the invention, a chemical etchant is introduced through trench 20. The etchant will etch the material of the mask 14 at a substantially higher rate than any layer of the second epitaxial GaN layer 17, first epitaxial GaN layer 12, or second substrate 18. In a preferred embodiment in which the second epitaxial layer 17 is GaN and the mask is silicon dioxide ($SiO_2$), the etchant is hydrofluoric acid (HF). The HF acid attacks the mask 14, and etches it away much more rapidly than it etches either the first epitaxial GaN layer 12, second epitaxial GaN layer 17, or the second substrate 18.

Figure 1E:
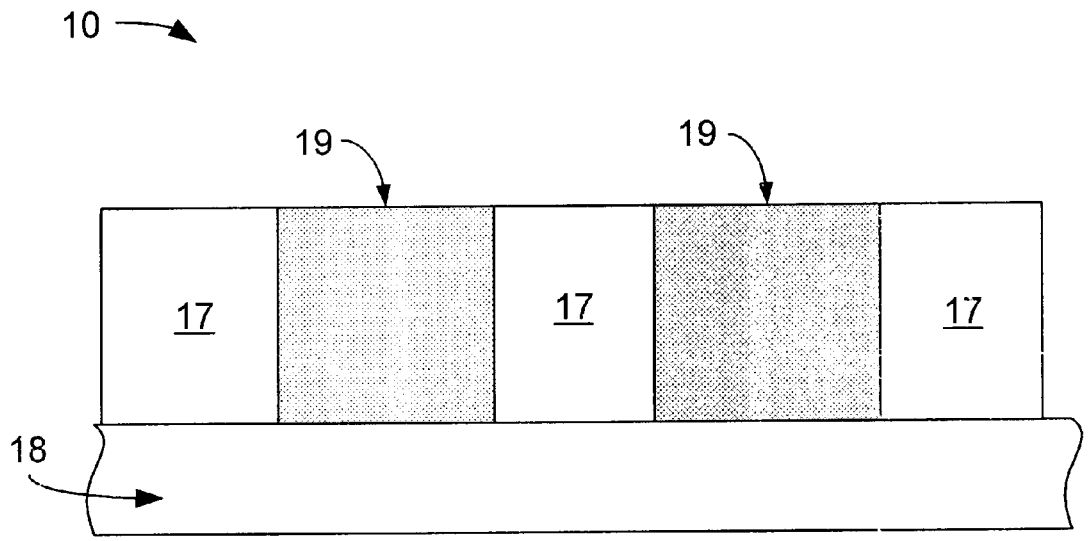

FIG. 1E illustrates the portion of epitaxial assembly 10 that includes the second substrate 18 and second epitaxial GaN layer 17. The assembly is shown flipped vertically such that second substrate 18 now appears at the bottom of the assembly. Etching away the mask 14 cleanly and efficiently detaches the second epitaxial GaN layer 17 from sapphire substrate 11 and first epitaxial GaN layer 12.

FIG. 1E also shows polyimide material 19 filling the trenches 20 between the individual strips into which the trench-forming operation shown in FIG. 1C divided the second epitaxial GaN layer 17. Polyimide material 19 protects the edges of the various material layers constituting second epitaxial GaN layer 17 during further device processing. These edges were exposed when trench 20 was etched. The material whose edges are exposed may include doped layers, cladding layers, and an active region containing multiple quantum wells. The polyimide material 19 prevents metallic material added during subsequent device processing from creating electrical shorts between the layers. Because the second epitaxial GaN layer 17 has been detached from the sapphire substrate by etching away the $SiO_2$ mask 14, none of the layers of the final laser structure has been subject to high temperatures that could decompose or damage its structure, as would occur using conventional detachment techniques. Therefore, GaN layer 17 includes semiconductor material with good optical properties and can be used as the basis of a high quality electro-optical device. For example, the good cleaving and electrical properties of the resultant epitaxial assembly 10 may be used to fabricate an edge-emitting laser.

Figure 2:
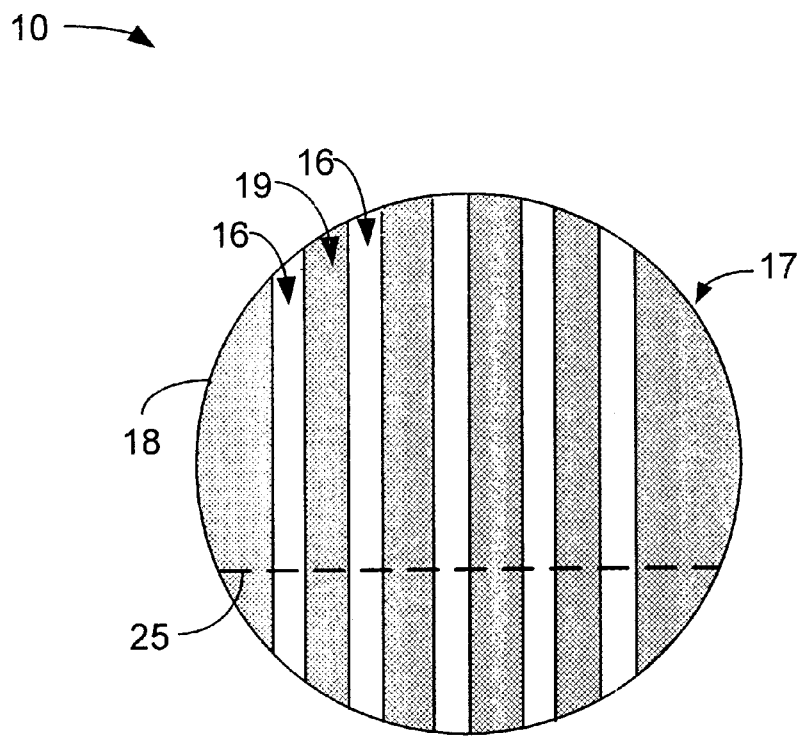
FIG. 2 is a plan view illustrating the epitaxial assembly of FIG. 1E.

FIG. 2 is a plan view illustrating the epitaxial assembly 10 of FIG. 1E. Second epitaxial GaN layer 17 is typically formed of strips 16 bonded to second substrate 18. When viewed from above as shown in FIG. 2, it can be seen that, to cleave the strips 16 of GaN to obtain a clean facet, a nick, or score, can be made in the second substrate 18 along line 25. The second substrate 18 and second epitaxial GaN layer 17 are snapped along this line resulting in the creation of a clean facet in exposed second epitaxial GaN material 17. Furthermore, the conductive second substrate 18 improves current distribution to all layers within GaN layer 17 because the current can flow directly from the conductive second substrate 18 into the device structure embodied in second epitaxial GaN layer 17.

FIGS. 3A–3E illustrate an alternative embodiment of the method for detaching an epitaxial layer from one substrate and transferring it to another in accordance with the invention. In the embodiment illustrated in FIGS. 3A–3E, the second epitaxial layer grown on the first epitaxial layer is of the same material as that of the first epitaxial layer. However, the second epitaxial layer is grown from a surface of a trench in order to reduce the occurrence of dislocation densities in the second epitaxial layer.

Figure 3A:
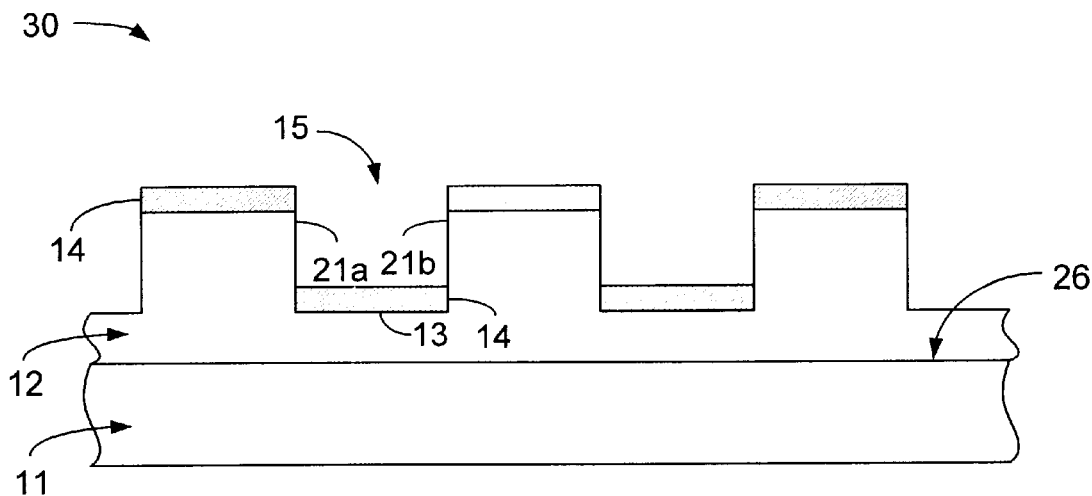
FIGS. 3A–3E are cross-sectional schematic views illustrating an alternative embodiment of the method for detaching an epitaxial layer from one substrate and transferring it to another.

Furthermore, the second epitaxial layer grown on the first epitaxial layer may be of a different material than that of the first epitaxial layer. Elements that are identical to those illustrated with respect to FIGS. 1A–1E will bear the same reference numerals. FIG. 3A shows epitaxial assembly 30. Epitaxial assembly 30 includes sapphire substrate 11 over which is grown a first epitaxial layer of GaN 12. After the first epitaxial GaN layer 12 is grown, first trench 15 is formed therein, preferably by etching. First trench 15 can be etched in first epitaxial GaN layer 12 preferably by an anisotropic etching method such as reactive ion etching.

Although illustrated has having side walls perpendicular to the major surface 26 of the substrate 11, trench 15 may alternatively have sloped side walls. Mask 14 is deposited over the top surface of first epitaxial GaN layer 12, the base 13 of trench 15, and optionally, over one side wall of trench 15. Mask 14 causes epitaxial growth to occur preferentially on the crystalline surfaces of first epitaxial GaN layer 12 that are not covered by mask 14. Mask 14 is applied both over the top surfaces of first epitaxial GaN layer 12 and also to the base 13 of trench 15. Additionally, mask 14 may be applied to one of the side walls of trench 15.

Mask 14 causes a second epitaxial layer 37 to grow laterally from side walls 21a and 21b. In this manner, the growth direction of second epitaxial layer 37 is rotated through 90°, or nearly 90° relative to the conventional growth direction, resulting in an epitaxial layer having fewer dislocation densities. The second epitaxial layer will grow preferentially from any exposed surface of first epitaxial GaN layer 12.

Figure 3B:
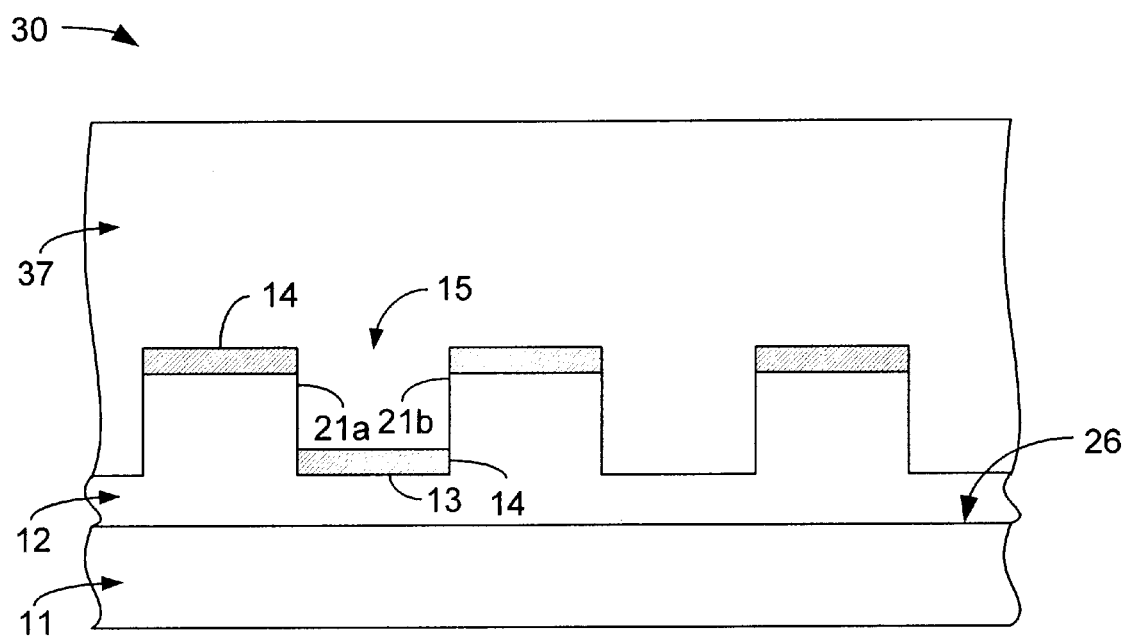

A second epitaxial layer 37 of GaN is then grown upon first epitaxial GaN layer 12 as shown in FIG. 3B. In accordance with that disclosed in commonly assigned, co-pending U.S. patent application Ser. No. 09/327,129, entitled "EPITAXIAL MATERIAL HAVING A CRACK-FREE REGION AND METHOD FOR PRODUCING SAME", filed on Jun. 7, 1999, (Attorney Docket No. 10990377), and hereby incorporated by reference, second epitaxial GaN layer 37 is laterally grown from one or both side walls 21a and 21b of first trench 15, depending upon the placement of mask 14. In this embodiment, second epitaxial GaN layer 37 is the same material as first epitaxial GaN layer 12, and therefore benefits from lateral growth in trench 15 as disclosed in the above-mentioned U.S. patent application.

Alternatively, second epitaxial layer 37 may be a different material from that of first epitaxial GaN layer 12, in which case the lateral growth thereof will serve to localize any cracks caused by lattice mismatch strain in the region of trench 15. Because cracks will be localized in the vicinity of trench 15, the portion of second epitaxial layer 37 that eventually grows out of trench 15 will be crack-free.

When second epitaxial GaN layer 37 is grown, it fills and eventually overflows trench 15 to form a continuous epitaxial layer over first epitaxial GaN layer 12. Alternatively, the growth of second epitaxial GaN layer 37 may be initiated from only one side wall of trench 15, in which case, the mask 14 would additionally be applied to the opposing wall of trench 15.

Although shown herein as a single layer of GaN material, second epitaxial GaN layer 37 may indeed include additional epitaxial layers such as doped semiconductor layers, cladding layers and an active layer. These additional layers are normally formed when making a semiconductor light emitting device, such as a semiconductor laser. It should be understood that second epitaxial GaN layer 37 may include many such additional layers as the device being fabricated requires. However, the concepts of the invention are applicable irrespective of the composition of second epitaxial GaN layer 37.

Figure 3C:
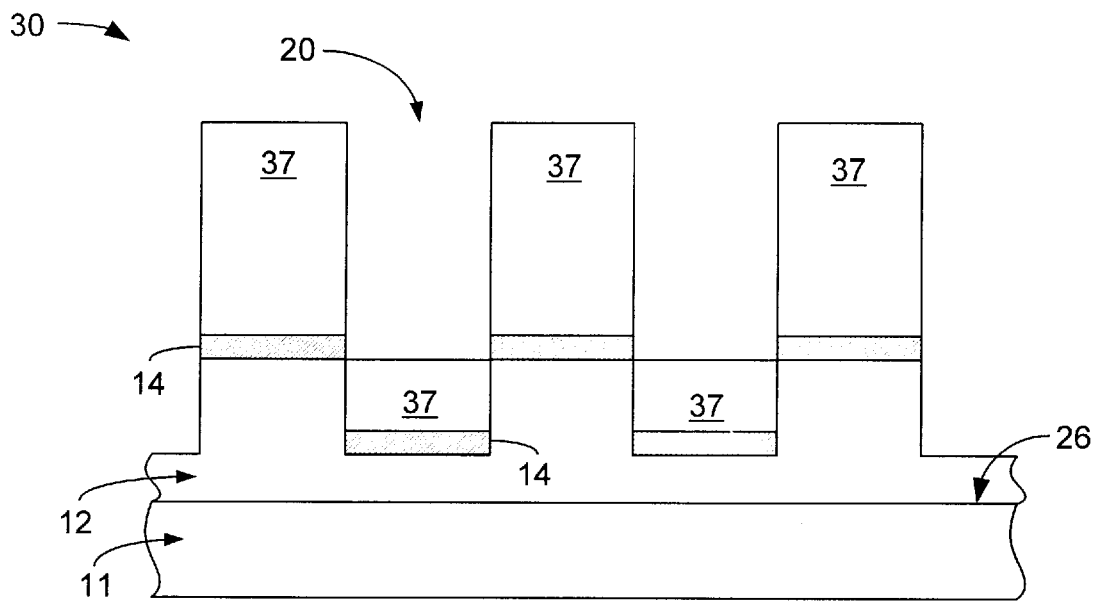

A second trench 20 is then formed that extends through the second epitaxial GaN layer 37 to expose mask 14, as shown in FIG. 3C. The second trench 20 may extend into the portion of the second epitaxial GaN layer 37 that was grown in first trench 15. Second trench 20 forms a channel through which an etchant, as described above, will later flow to remove mask 14. The trench forming operation needs to remove enough of the second epitaxial GaN layer 37 so that only the portions of second epitaxial GaN layer 37 that are joined to first epitaxial GaN layer 12 by the mask 14 remain.

Second trench 20 is, for example but not limited to, etched through second epitaxial GaN layer 37 at least to the level of the portion of mask 14 that lies closer to the exposed surface of second epitaxial GaN layer 37 as shown in FIG. 3C. It should be mentioned that trench 20 may also extend completely through the first epitaxial GaN layer 12 to sapphire substrate 11 to enhance etchant flow.

Figure 3D:
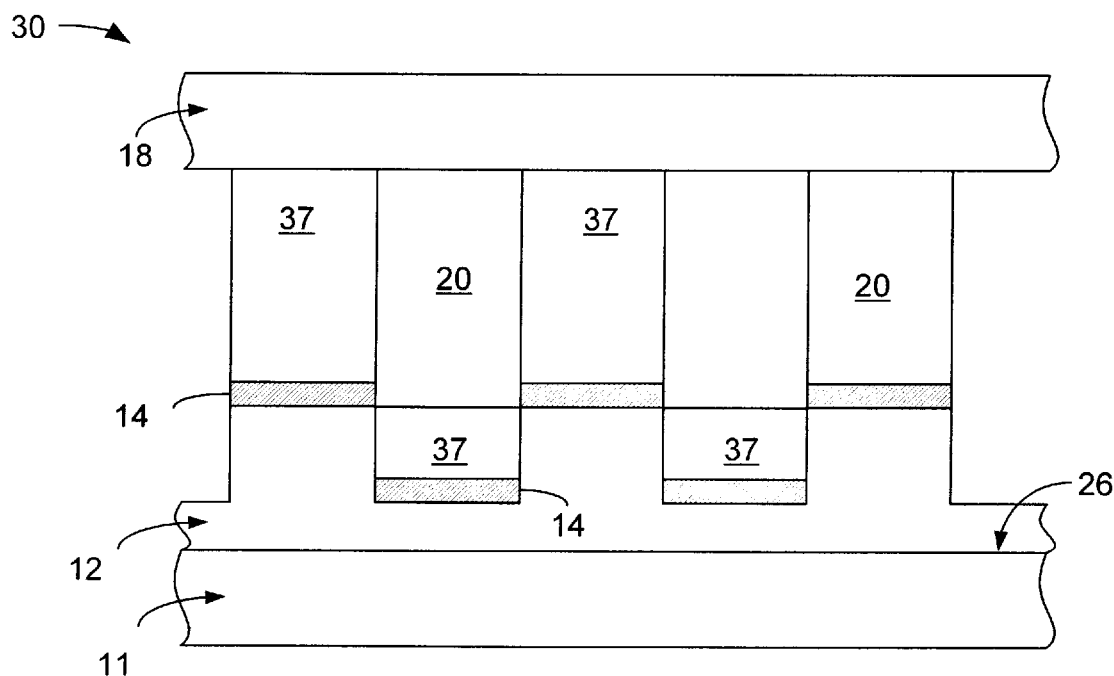

In similar fashion to that described above with respect to FIG. 1D, a second substrate 18 is applied over the exposed surface of second epitaxial GaN material 37 as illustrated in FIG. 3D. In this embodiment, a second substrate 18 is bonded to the exposed surfaces of second epitaxial GaN layer 37 by wafer bonding as known to those skilled in the art. In this embodiment, the second substrate 18 is a conductive substrate of silicon. However, the material of the second substrate 18 may be selected for its good cleaving properties and should also exhibit the qualities described above.

In accordance with the invention, a chemical etchant is introduced through second trench 20. The etchant will etch the material of the mask 14 at a substantially higher rate than any layer of the second epitaxial GaN layer 37, first epitaxial GaN layer 12, or second substrate 18. In this embodiment in which the second epitaxial layer 37 is GaN and the mask 14 is silicon dioxide ($SiO_2$), the etchant is hydrofluoric acid (HF). The HF acid attacks the mask 14, and etches it away much more rapidly than it etches either the first epitaxial GaN layer 12, second epitaxial GaN layer 37, or second substrate 18.

Figure 3E:
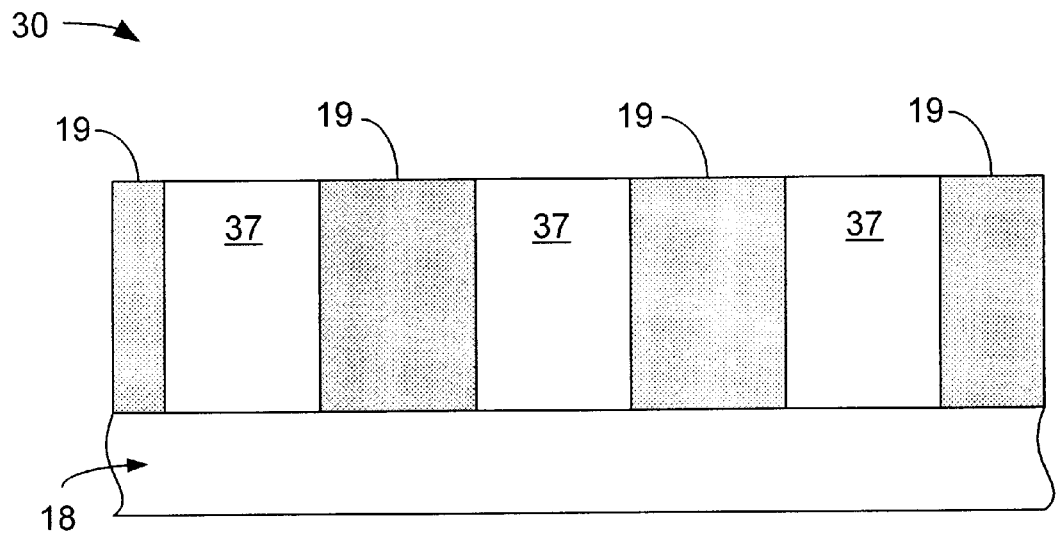

FIG. 3E illustrates the portion of epitaxial assembly 30 which includes the second substrate 18 and second epitaxial GaN layer 37. The assembly is shown flipped vertically such that second substrate 18 now appears at the bottom of the assembly. Etching away the mask 14 cleanly and efficiently detaches second epitaxial GaN layer 37 from sapphire substrate 11 and first epitaxial GaN layer 12.

FIG. 3E also shows polyimide material 19 filling the trenches 20 between the individual strips into which the trench forming operation shown in FIG. 3C divided the second epitaxial GaN layer 37 in similar fashion to that described above with respect to FIG. 1E. Polyimide material 19 protects the edges of the various material layers, constituting second epitaxial GaN layer 37 during further device processing. These edges were exposed when trench 20 was etched. The material whose edges are exposed may include doped layers, cladding layers, and an active region containing multiple quantum wells.

The polyimide material 19 prevents metallic material added during subsequent device processing from creating electrical shorts between the layers. Because the second epitaxial GaN layer 37 has been detached from the sapphire substrate by etching away the $SiO_2$ mask 14, none of the layers of the final laser structure has been subject to high temperatures that could decompose, or damage its structure, as would occur using conventional detachment techniques.

Therefore, GaN layer 37 includes semiconductor material with good optical properties and can be used as the basis of a high quality electro-optical device. The resulting epitaxial assembly 10 may be used to fabricate an edge-emitting laser as it has good cleaving properties and good electrical properties.

Figure 4:
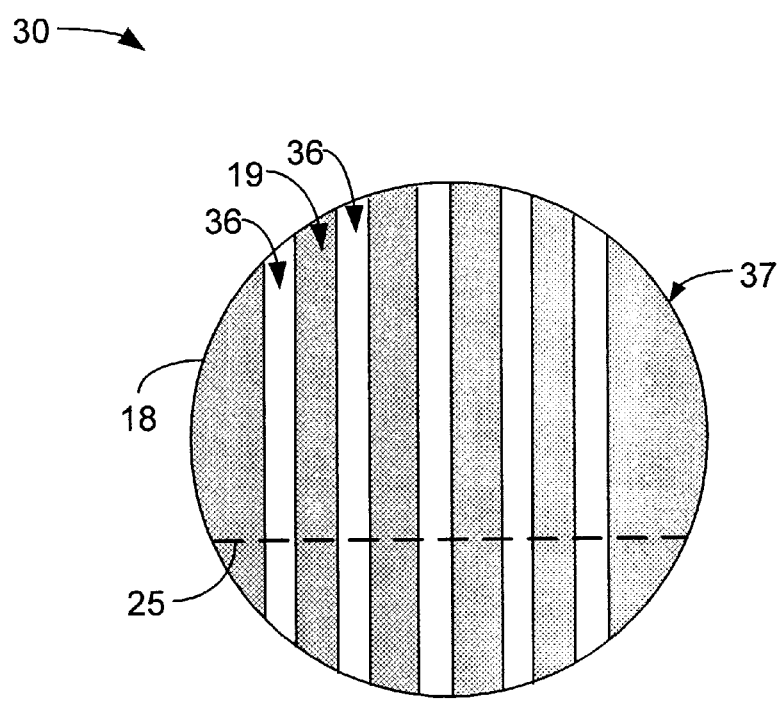
FIG. 4 is a plan view illustrating the epitaxial assembly of FIG. 3E.

FIG. 4 is a plan view illustrating the epitaxial assembly 30 of FIG. 3E. Similar to that described with respect to FIG. 2, second epitaxial GaN layer 37 is typically formed of strips 36 bonded to second substrate 18. When viewed from above as shown in FIG. 4, it can be seen that, to cleave the strips of GaN 37 to obtain a clean facet, a nick, or score, can be made in the silicon substrate, GaN strips 36 and polyimide material 19 along line 25. The second substrate 18 and second epitaxial GaN layer 37 can be snapped along this line resulting in the creation of a dean facet in exposed second epitaxial AlGaN material 37.

Furthermore, the conductive second substrate 18 improves current distribution to all layers within GaN layer 37 because the current can flow directly from the conductive second substrate 18 into the device structure embodied in second epitaxial AlGaN layer 37.

Figure 5:
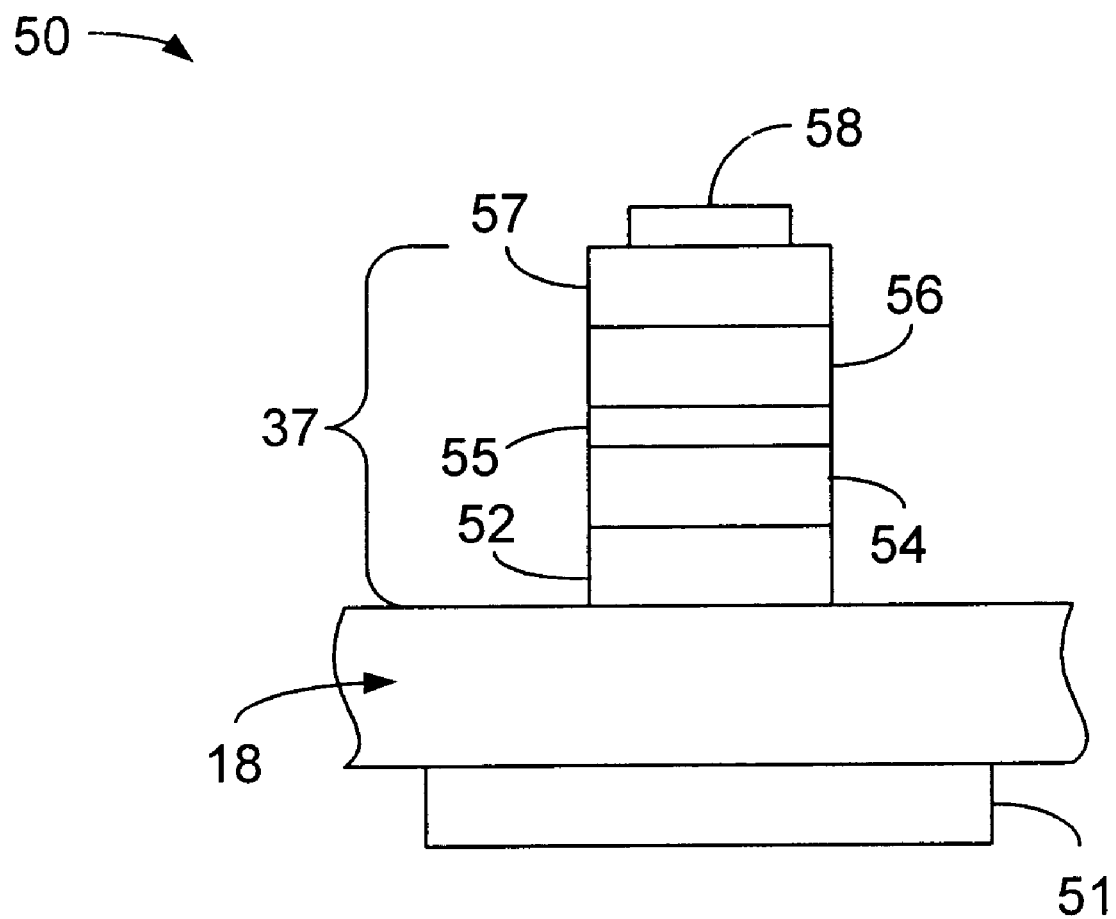
FIG. 5 is a cross-sectional schematic view illustrating an edge-emitting laser constructed using the material shown in FIG. 3E.

FIG. 5 is a cross-sectional schematic view illustrating an edge-emitting laser 50 constructed using the GaN material 37 of FIG. 3E. The conductive substrate 18, which in this embodiment is p-type silicon, has p-type electrode 51 applied thereto. The second substrate 18 should be easy to cleave, and be preferably highly conductive to form a low resistance contact with second epitaxial GaN layer 37. Conductive substrate 18 may be another p-type material, such as, but not limited to, p-type gallium phosphide (GaP) or p-type indium phosphide (InP). The second epitaxial GaN layer 37 illustratively includes p-type layer 52 over which p-type cladding layer 54 is applied. Over p-type cladding layer 54 is grown active layer 55. Active layer 55 includes multiple quantum wells (MQW's) as known to those skilled in the art.

Over active layer 55 is applied n-type cladding layer 56, which is similar in structure and function to cladding layer 54. Cladding layers 54 and 56 provide carrier confinement and optical confinement of the light within edge-emitting laser device 50. Over cladding layer 56 is grown n-type layer 57. Over n-type layer 57 is applied n-type contact material 58.

In accordance with the invention, all layers that comprise second epitaxial GaN layer 37 were formed prior to second epitaxial GaN layer 37 being detached from first epitaxial GaN layer 12.

Figure 6A:
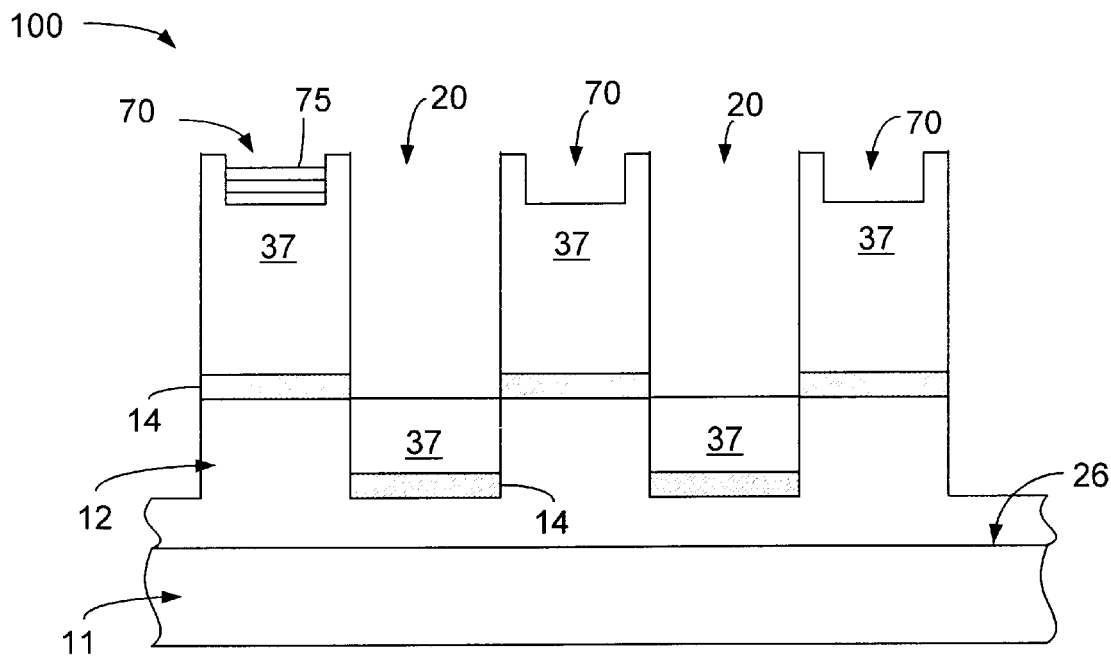
FIGS. 6A–6C are cross-sectional schematic views illustrating using the method of FIGS. 3A through 3E to construct a vertical cavity surface emitting laser (VCSEL)
Figure 6B:
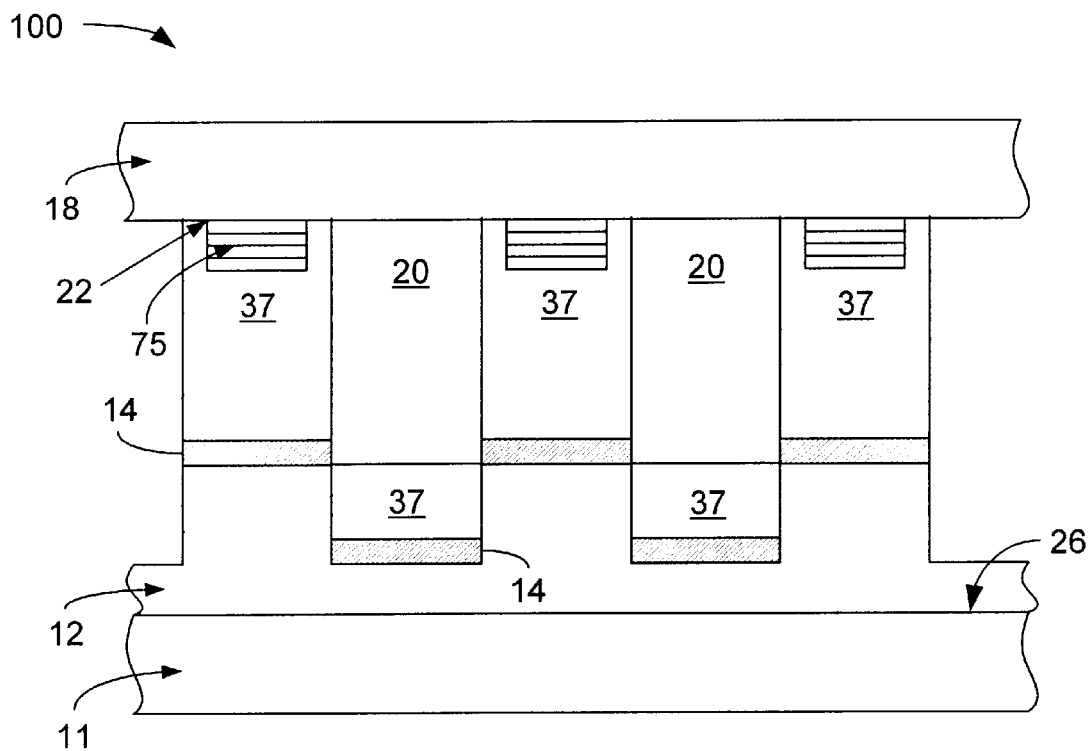
Figure 6C:
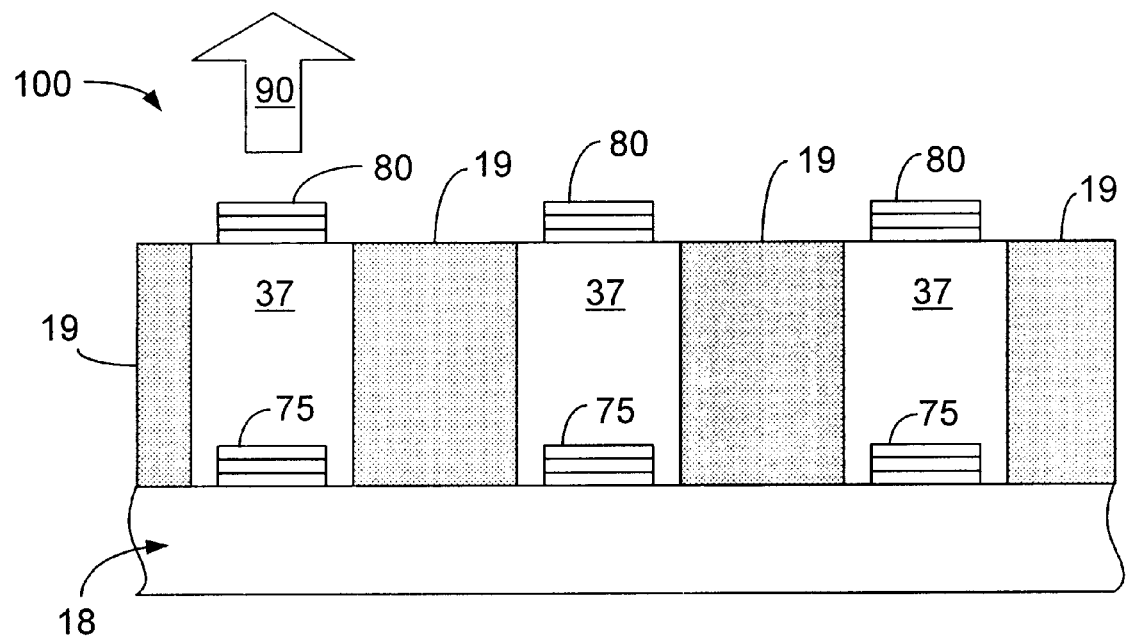

FIGS. 6A–6C illustrate the use of the method of the invention to construct a vertical cavity surface emitting laser (VCSEL) incorporating epitaxial assembly 100. As mentioned above, second epitaxial GaN layer 37 includes a plurality of layers including a multiple quantum well active layer. FIG. 6A is a schematic view similar to that depicted in FIG. 3C, however, additional trench 70 is formed in second epitaxial GaN layer 37. Additional trench 70 may be etched using techniques similar to those described with respect to FIGS. 3A and 3C.

The method of the invention enables dielectric DBR 75 with superior optical properties to a GaN/AlGaN DBR to be deposited within additional trench 70. DBR 75 may be comprised of multiple layers of dielectric material having alternating compositions to produce a structure with layers of alternating values of refractive index. The difference between the refractive indices of the high index and the low index layers and the number of layers determines the reflectivity of the mirror. The thickness of each low index and high index layer in such a mirror is $\lambda/4n$ (or odd multiples thereof), where $\lambda$ is the in-vacuum wavelength of light that the VCSEL is designed to emit, and n is the refractive index of the material. Note that any odd integer multiple of $\lambda/4n$ may be used. For example, material thickness of $3\lambda/4n$ or $5\lambda/4n$ may be used as well.

Referring now to FIG. 6B, shown is a cross-sectional schematic view of epitaxial assembly 100 of FIG. 6A having second substrate 18 bonded thereto. Second substrate 18 is preferably silicon. Electrical contact between second substrate 18 and second epitaxial GaN layer 37 is made at region 22, which provides a low impedance path for the current to flow from second substrate 18 to the laser structure in second epitaxial AlGaN layer 17.

In accordance with the invention, a chemical etchant is introduced through trench 20. The etchant will etch the material of the mask 14 at a substantially higher rate than any layer of the second epitaxial GaN layer 37, first epitaxial GaN layer 12, or second substrate 18. In this embodiment in which the second epitaxial layer 37 is GaN and the mask is silicon dioxide ($SiO_2$), the etchant is hydrofluoric acid (HF). The HF acid attacks the mask 14, and etches it away much more rapidly than it etches either the first epitaxial GaN layer 12, second epitaxial GaN layer 37, or the second substrate 18.

FIG. 6C illustrates the portion of epitaxial assembly 100 which includes the second substrate 18 and the second epitaxial GaN layer 37. The assembly is shown flipped vertically such that second substrate 18 now appears at the bottom of the assembly. Etching away the mask 14 cleanly and efficiently detaches the second epitaxial GaN layer 37 from sapphire substrate 11 and first epitaxial GaN layer 12. Polyimide material 19 is applied between the individual strips of second epitaxial GaN layer 37 in similar fashion to that described above. In addition, a second high quality dielectric DBR 80 having superior optical properties compared with a GaN/AlGaN DBR is grown over second epitaxial GaN layer 37, the DBR 80 having characteristics similar to DBR 75. However, the comparative reflectivity of DBRs 75 and 80 is different depending upon the desired light output direction. For example, for the light output indicated by arrow 90, DBR 80 would have a slightly lower reflectivity than DBR 75. Polyimide material 19 may be etched away prior to the growth of second DBR 80.

Figure 7:
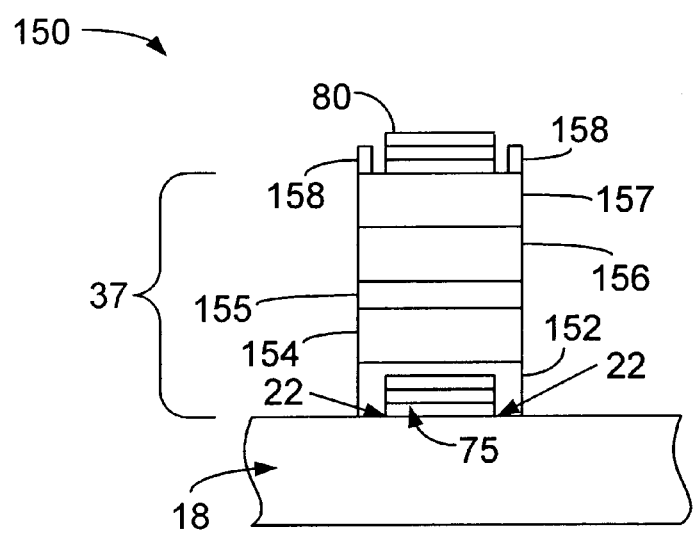
FIG. 7 is a cross-sectional schematic view illustrating a VCSEL constructed using the method of FIGS. 6A–6C.

FIG. 7 is a cross-sectional schematic view illustrating a vertical cavity surface emitting laser 150 constructed using the method described with respect to FIGS. 6A–6C. Over second substrate 18 resides the second epitaxial AlGaN layer 37 referred to with respect to FIGS. 6A–6C. The second epitaxial AlGaN layer 37 illustratively includes DBR 75 within p-type material 152. P-type material 152 is electrically connected to second substrate 18 at contact region 22. Over p-type material 152 is cladding layer 154, over which is grown active region 155. Active region 155 is constructed in a manner known to those skilled in the art and includes multiple quantum wells similar to active layer 55 described with respect to FIG. 5. Over active layer 155 is grown cladding layer 156, which together with cladding layer 154 provides carrier confinement as known in the art. Over cladding layer 156 is grown n-type material 157. DBR 80 is grown over n-type material 157. Also deposited over n-type material 157 is n-type contact material 158.

It will be apparent to those skilled in the art that many modifications and variations may be made to the preferred embodiments of the invention, as set forth above, without departing substantially from the principles of the invention. For example, the method for detaching an epitaxially grown layer from one substrate and transferring it to another substrate can be used to fabricate light emitting diodes and other high quality optical devices. All such modifications and variations are intended to be included herein within the scope of the invention, as defined in the claims that follow.

What is claimed is:

1. A method for detaching an epitaxial layer from one substrate and transferring the epitaxial layer to another substrate, the method comprising the steps of:
   growing a first epitaxial layer over a first substrate;
   depositing a mask over a portion of a surface of said first epitaxial layer;
   growing a second epitaxial layer over said first epitaxial layer;
   forming a trench in said second epitaxial layer to expose said mask;
   bonding a second substrate to said second epitaxial layer; and
   introducing an etchant through said trench to etch said mask to detach said second epitaxial layer from said first epitaxial layer.

2. The method of claim 1, wherein said first substrate includes sapphire.

3. The method of claim 1, wherein said first epitaxial layer includes gallium nitride (GaN).

4. The method of claim 1, wherein said second epitaxial layer includes gallium nitride (GaN).

5. The method of claim 1, wherein said second epitaxial layer includes aluminum gallium nitride (AlGaN).

6. The method of claim 1, wherein said mask includes silicon dioxide ($SiO_2$).

7. The method of claim 1, wherein said second substrate is chosen from the group consisting of: silicon (Si), gallium phosphide (GaP), and indium phosphide (InP).

8. The method of claim 1, wherein said second epitaxial layer comprises additional epitaxial layers, said additional epitaxial layers forming a semiconductor light emitting device.

9. The method of claim 1, wherein said etch is performed using hydrofluoric acid (HF).

10. The method of claim 1, further comprising the steps of:

forming an additional trench in a surface of said second epitaxial layer prior to said step of bonding said second substrate;

depositing dielectric layers to form a distributed Bragg reflector (DBR) within said additional trench; and depositing, after said etching step, additional dielectric layers to form a second DBR over said second epitaxial layer.

11. The method of claim 1, further comprising the step of cleaving said second substrate and said second epitaxial layer.

12. A high quality gallium nitride (GaN) epitaxial material produced in accordance with the method of claim 4.

* * * * *